United States Patent [19]

Brust

[11] Patent Number: 4,954,773
[45] Date of Patent: Sep. 4, 1990

[54] VOLTAGE MEASUREMENT WITH AN ELECTRON PROBE WITHOUT EXTERNAL TRIGGER SIGNAL

[75] Inventor: Hans D. Brust, Dudweiler, Fed. Rep. of Germany

[73] Assignee: Siemens Aktiengesellschaft, Berlin and Munich, Fed. Rep. of Germany

[21] Appl. No.: 227,304

[22] Filed: Jul. 28, 1988

[30] Foreign Application Priority Data

Aug. 6, 1987 [DE] Fed. Rep. of Germany ....... 3726234

[51] Int. Cl.⁵ .......................................... G01R 19/28
[52] U.S. Cl. .............................................. 324/158 R
[58] Field of Search .............. 324/73 PC, 71.3, 158 R, 324/158 D; 250/310, 311

[56] References Cited

U.S. PATENT DOCUMENTS

| | | |
|---|---|---|
| 4,169,229 | 9/1979 | Feuerbaum . |
| 4,223,220 | 9/1980 | Feuerbaum . |
| 4,292,519 | 9/1981 | Feuerbaum . |
| 4,464,571 | 8/1984 | Plies . |
| 4,689,555 | 8/1987 | Brust et al. ...................... 324/158 R |
| 4,788,495 | 11/1988 | Plies ................................ 324/158 D |

FOREIGN PATENT DOCUMENTS 0048858 1/1986 European Pat. Off. .

OTHER PUBLICATIONS

"Electron Beam Testing" by Wolfgang, Microelectronic Engineering, 4, 1986, pp. 77-106.
"Voltage Coding: Temporal Versus Spatial Frequencies" by Lukianoff et al., Scanning Electron Micro, 1975, (part I), pp. 465-471.
"Frequency, Tracing & Mapping in Theory & Practice" by Brust et al., Micro. Engineering, Unit 2, No. 4, 1985, pp. 304-311.
"Electron Beam Testing: Methods & Applications" by Feuerbaum, Scanning, vol. 5, pp. 14-24, 1983.
"IC-Internal Electron Beam Logic State Analysis" by Ostrow et al., Scanning Electron Micro., 1982, pp. 563-572.
"Model 162 Boxcar Integrator, Operating & Service Manual" by Princeton Appl. Res., 1976.
"Halbleiter-Schaltungstechnik" by Tietze et al., 1980, pp. 709-712.

Primary Examiner—Reinhard J. Eisenzopf
Assistant Examiner—Edward Urban
Attorney, Agent, or Firm—Hill, Van Santen, Steadman & Simpson

[57] ABSTRACT

Voltage measurement with a particle probe without external trigger signal. Methods and apparatus are provided for voltage measurement with a particle probe without an external trigger signal of a signal having at least one fixed frequency, fs. The known arrangements for voltage measurement with an external trigger signal remain fundamentally unaltered; however, the required trigger signal is derived from the measured signal itself.

22 Claims, 2 Drawing Sheets

VOLTAGE MEASUREMENT WITH AN ELECTRON PROBE WITHOUT EXTERNAL TRIGGER SIGNAL

BACKGROUND OF THE INVENTION

The present invention is directed to methods and apparatus for voltage measurement with a particle probe without an external trigger signal.

Numerous methods are known in the prior art for acquiring signal curves of periodic test signals with a particle beam. A summary of currently standard test methods is reproduced in the publication "Microelectronic Engineering" 4 (1986), pages 77 through 106, "Electron Beam Testing", by E. Wolfgang, particularly on page 83. A distinction is made between measurements that are carried out in the time domain and measurements that are carried out in the frequency domain. Including in the first, for example, are "Voltage Coding" (also see "Scanning Electron Microscopy" 1975 (part I) Proc. of the 8th Annual Scanning Electron Microscope Symposiuim, Chicago, IIT Research Institute, pages 465 through 471) or "Logic State Mapping" (also see U.S. Pat. No. 4,223,220), whereas what is referred to as a "Frequency Mapping Method" is included in the latter.

In both cases (measurements in the time and frequency domain), a focused primary particle beam is directed onto a specimen surface to be scanned with the use of deflection coils. A detector collects the triggered secondary particles thereby an the interpretation of a resulting secondary signal occurs in a signal chain.

In most measurements in the time domain, it is necessary to have a trigger signal available that is synchronized to a signal in the specimen, for example an integrated circuit (IC). Such a trigger signal is necessary in order to acquire a measured signal from the secondary signal by a sampling method or by a combined sampling and averaging method in a part of a signal chain, for example in a measurement processing arrangement.

Among other things, voltage measurement based on the "Waveform Measurement" method on which the method of the present invention is based is explained in the publication Scanning, Vol. 5, pages 14 through 24 (1983) (especially pages 18 through 20), "Electron Beam Testing: Methods and Applications" by H. P. Feuerbaum. The implementation of this method with the use of a boxcar integrator is set forth in FIG. 10 (page 20) of this publication. The block diagram structure of the boxcar integrator is essentially composed of a phase control unit, of a delay unit, of a gate circuit and of a measurement processing unit. European Pat. No. 00 48 858 also sets forth the structure and the functioning of a boxcar integrator.

Many integrated circuits, however, have asynchronous circuit components whose internal signals cannot have their frequency acquired from applied external signals or there are free running oscillators in the IC whose signals are not externally accessible. In such cases, an externally generated trigger signal is not available.

Asynchronous circuit components such as, for example, free running oscillators, can be currently investigated only with real-time methods. The use of real-time methods, however, is limited to relatively slow signals (see Scanning Electron Microscopy (1982), "IC-Internal Electron Beam Logic State Analysis" by M. Ostrow, E. Menzel, E. Postulka, S. Goerlich, E. Kubalek, pages 563 through 572. Also, obtainable precision is low because of the poor signal-to-noise ratio. The methods usually utilized for fast signals, by contrast, use a combined sampling and averaging principle. A boxcar integrator that works based on the combined sampling and averaging method is, for example, a model 162 of Princeton Applied Research, described in the "Princeton Applied Research Operating and Service Manual". To this end, however, a trigger signal for controlling the measurement processing arrangement in the signal chain is necessary.

SUMMARY OF THE INVENTION

An object of the present invention is to provide methods and apparatus wherein a voltage measurement with a particle probe is carried out without an externally generated trigger signal or without a trigger signal acquired from a periphery circuit, for example from a drive circuit.

The advantages achieved with the invention are that the arrangement previously used for voltage measurement with an external trigger signal (for example, the arrangement for the "waveform measurement" method in FIG. 10 of the above-recited publication by H. P. Feuerbaum, "Electron Beam Testing: Methods and Applications") remains fundamentally unaltered for the implementation of the method of the present invention. Acquiring the trigger signal from the secondary signal makes it possible to perform measurements of both synchronous and asynchronous circuit components, e.g. of free running oscillators. A limitation that the trigger signal be acquired from the input signals applied by the drive circuit is eliminated.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
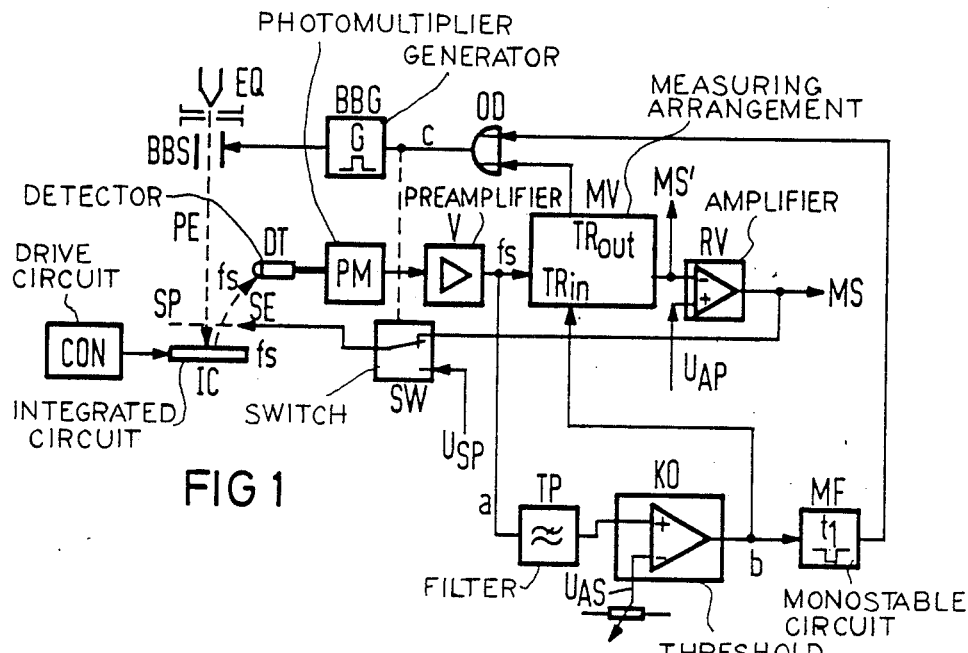
FIG. 1 is a block diagram of an apparatus related to the method of the present invention, whereby the trigger signal is filtered directly out of the secondary signal.

FIG. 1 shows an apparatus for voltage measurement with an electron probe, whereby a trigger signal for a measurement processing arrangement MV is filtered directly out of a secondary signal. Primary electrons PE emerge from an electron source EQ, these primary electrons PE impinging on a measuring point (interconnect) within an integrated circuit IC and triggering secondary electrons SE. These secondary electrons SE are detected by a detector DT. Depending on the secondary electron current that impinges the detector DT, a secondary electron signal is generated in this detector. This secondary electron signal is conducted to a photomultiplier PM where it is amplified. The secondary electron signal amplified in the photomultiplier PM is transferred via a preamplifier V to a measurement processing arrangement MV. The measurement processing arrangement MV in FIGS. 1, 2 or 3 can for example be constructed with a boxcar integrator. A feedback control amplifier RV is connected to an output of the measurement processing arrangement MV. P, PI or PID regulators particularly come into consideration as the feedback control amplifier. The feedback-control amplifier RV compares the identified secondary electron signal to a voltage $U_{AP}$ that determines the operating point of the control. A control signal is taken at the output of the feedback control amplifier RV and is further supplied to the control electrode of a secondary electron spectrometer SP. For example, the retarding field electrode of a retarding field spectrometer can be used as the control electrode. Such a retarding field spectrometer is disclosed, for example, in U.S. Pat. No. 4,464,571 (incorporated herein by reference). The output signal MS of the feedback control amplifier RV or the voltage at the retarding field electrode can then serve as a measured signal. When no value is attached to an exact voltage measurement but if one merely wishes to roughly define the voltage level at the respective measuring point, then a feedback circuit can also be eliminated and the output signal of the measurement processing arrangement MSL can be directly used as the measured signal. In this case, the control electrode of the spectrometer SP is either connected to a constant voltage or the spectrometer can be completely eliminated.

When the beam of the primary electron PE impinges a measuring point in the integrated circuit IC or some other specimen and when the measuring point carries a signal that has a fundamental frequency fs that is initially unknown, the current of the secondary electrons SE that is ultimately supplied to the measuring processing arrangement MV as a secondary electron signal also contains a signal component having the initially unknown frequency fs. The signal component having the initially unknown frequency fs can therefore be filtered out of this secondary electron signal SE in the measurement processing arrangement MV. For supplying the integrated circuit IC, desired drive signals are provided by a drive circuit CON.

In FIG. 1, the trigger signal required for the measurement processing arrangement MV is directly filtered out of the measured secondary electron signal. To this end, the secondary electron signal is taken after the pre-amplifier V and before the measurement processing arrangement MV and is supplied to a band-pass or low-pass filter TP. The filter TP makes it possible to filter out the desired fundamental frequency fs, this being critical for the trigger signal. Under certain conditions, a filter can be eliminated altogether since the detector, the photomultiplier and the preamplifier that are located in the signal chain have a low-pass characteristic. The output of the low-pass filter TP is connected to a threshold switch Ko that compares a threshold $U_{AS}$ to the secondary electron signal that has been filtered out. A fast comparator having a positive input connected to the low-pass filter TP and having a negative input connected to the threshold voltage $U_{AS}$ is used as the threshold switch Ko. The use of a comparator having switching hysteresis is especially beneficial since a slight noise level does not produce any jitter of the trigger signal. Moreover, it can be advantageous for the comparator to have an adjustable delay time during which an upward or downward transgression of the threshold circuit does not lead to a modification of the output signal of the comparator or to a new trigger signal at the output. For complex signals at the measuring point, such an adjustable delay time avoids a mistriggering. The output of this comparator is connected both to a monostable circuit MF as well as to the trigger input $TR_{IN}$ of the measurement processing arrangement MV. An OR gate OD has its first input connected to the monostable circuit MF and has its second input connected to the measurement processing arrangement MV via the trigger output $TR_{OUT}$ and its output feeds the generator BBG for the drive of a gating/blanking system BBS. For this arrangement, it is recommendable to provide a constant voltage at the control electrode of the spectrometer for the acquisition of the trigger signal so that the time of triggering is not shifted due to a modified voltage on the control electrode. The switch SW in one position provides the feedback for the actual voltage measurement and in the other position applies the constant voltage $U_{SP}$ to the retarding field electrode.

When no trigger signal is present at the output of the comparator Ko at point b, then the primary electron beam PE is constantly gated (switched on) via the beam blanking system BBS, the generator BBG, the OR gate OD and the monostable circuit MF for the acquisition of the trigger signal. For the actual voltage measurement, a trigger signal is filtered out of the secondary electron signal SE via the low-pass filter TP and via the comparator Ko and is supplied to the measurement processing arrangement MV and to the monostable circuit MF. With this trigger signal, the monostable circuit MF blanks the primary electron beam PE via the OR gate the generator BBG and the beam blank system BBS for a time duration of $t_1$ (time window). During this time window, the measurement processing arrangement MV outputs a second trigger signal based on the first trigger signal, outputting it to the OR gate OD, and the voltage measurement is carried out with a short primary electron pulse. After the time duration $t_1$, the primary electron beam PE is again constantly gated for synchronization The time resolution of the measurement is now only determined by the duration of the primary electron pulse.

Figure 2:
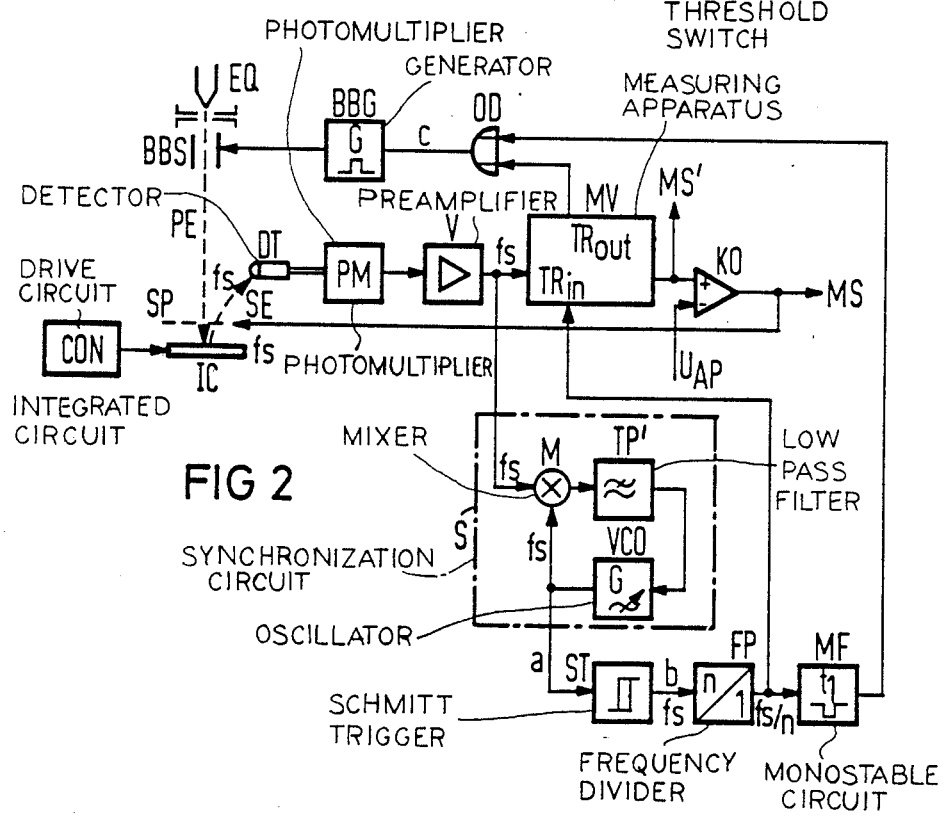
FIG. 2 is a block diagram of an apparatus related to the method of the present invention, whereby the trigger signal is acquired from the secondary signal with the use of a synchronization circuit.

If the secondary electron signal SE has a high noise level, this can lead to a great amount of jitter of the trigger signal and to a falsification of the measured result even with the use of a comparator having switching hysteresis. In this case, more meaningful results are obtained by using a voltage-controlled frequency oscillator to synchronize a second auxiliary signal with the secondary electron signal to be measured and to derive a trigger signal from this auxiliary signal. FIG. 2 is a block diagram of a circuit embodiment in which the secondary electron signal is supplied to a synchronization circuit S that generates the auxiliary signal that is synchronous with the fundamental frequency of the secondary electron signal to be measured.

Except for the synchronization circuit S, the following Schmitt trigger circuit ST and the frequency divider FP, the circuit of FIG. 2 corresponds to the circuit of FIG. 1. For this reason, the remaining reference characters of the circuit components are identical to the reference characters of the circuit components of FIG. 1. The input of the synchronization circuit S is connected to a location in the signal chain following the pre-amplifier V and preceding the measurement processing arrangement MV. A Schmitt trigger circuit ST or a comparator circuit is connected to the output of the synchronization circuit S and a frequency divider FP that reduces the frequency of the second auxiliary signal to the $n^{th}$ part (n= whole number) is connected to this Schmitt trigger circuit ST or the comparator circuit. The output of the frequency divider FP is connected both to the monostable circuit MF as well as to the trigger input $TR_{IN}$ of the measurement processing arrangement MV. The synchronization circuit S contains a phase detector that in this embodiment is a mixing stage M and a low-pass filter TP', and also contains a voltage-controlled frequency oscillator VCO. The phase detector whose first input forms the input of the synchronization circuit S and whose second input is connected to the output of the voltage-controlled frequency oscillator VCO and simultaneously forms the output of the synchronization circuit S compares the frequencies of the two signals on at its inputs. The two signals are multiplied together in the mixing stage M. The output of the mixing stage M is connected to the low-pass filter TP'. Using this low-pass filter TP', only signals having the difference frequency formed from the signals at the first and second inputs of the mixing stage M are transferred to the following, voltage-controlled frequency oscillator VCO. As a result of the feedback loop composed of the phase detector and of the voltage-controlled frequency oscillator VCO, the second, generated auxiliary signal at the output of the synchronization circuit S is synchronized with the frequency of the secondary electron signal at the input of the synchronization circuit S. Of course, other types of phase detectors as disclosed, for example, in Tietze/Schenk, Halbleiterschaltungstechnik, Fifth edition (1980), pages 709 through 712, Chapter "Frequenzempfindlicher Phasendetektor" can be used in place of the phase detector composed of the mixing stage M and of the lowpass filter TP'.

For synchronization, the primary electron beam PE must be constantly gated, as in the FIG. 1 circuit. In order to obtain a high chronological resolution, only a short primary electron pulse should be generated for the actual voltage measurement based on the sampling principle. At every $n^{th}$ period of the secondary electron signal, the primary electron beam PE is blanked via a frequency divider FP and via a monostable circuit MF for the duration of the time window $t_f$ to be measured. As already set forth with reference to FIG. 1, the measurement processing arrangement MV generates a second trigger signal during this time and thereby records the voltage at the measuring location with high chronological resolution. The short time during which the primary electron beam PE is blanked does not disturb the synchronization circuit which has a PLL circuit in this embodiment and, thus, does not disturb the synchronization. This arrangement makes it possible to measure signals whose fundamental frequency is lower than the bandwidth of the signal chain (detector DT, photomultiplier PM, preamplifier V. In case the PLL circuit recovers fast enough after the generation of a trigger pulse and, thus, after a voltage measurement, the frequency divider FP can also be entirely eliminated. In this case, n=1 would apply.

Figure 3:
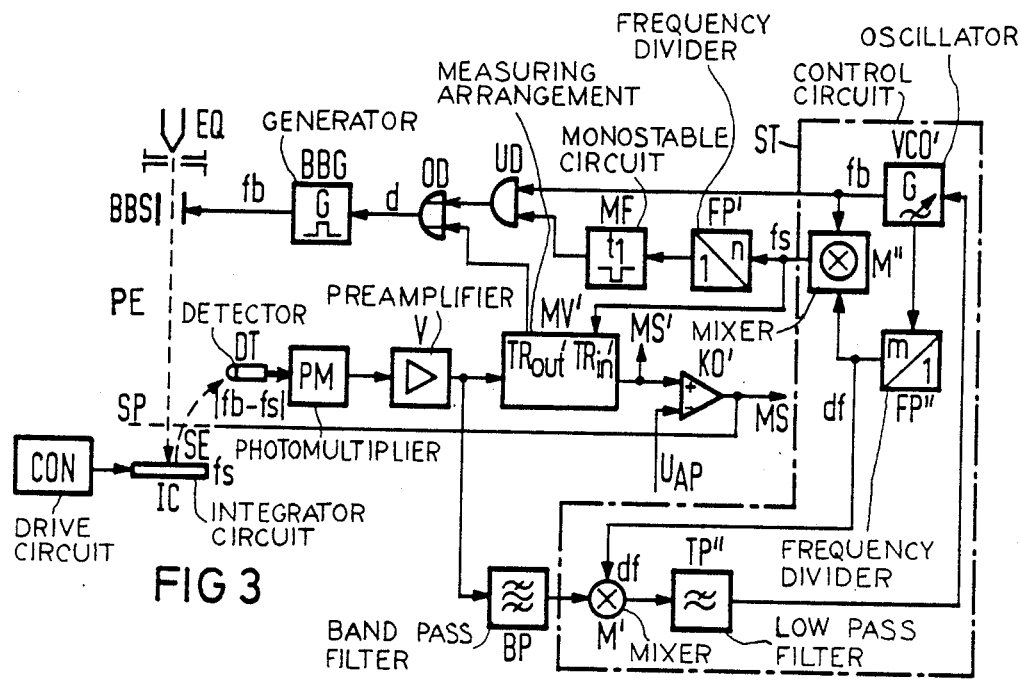
FIG. 3 is a block diagram of an apparatus related to the method of the present invention for high frequencies based on the "frequency mapping" method.
Figure 4A:
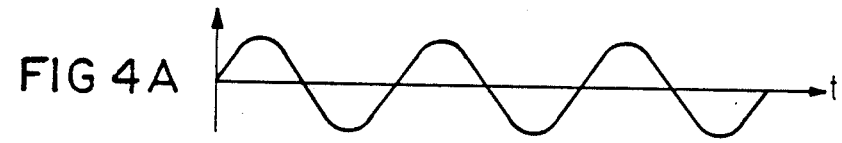
FIG. 4A is a graph of the signal in FIGS. 1 and 2 preceding the comparator $K_{oV}$ (FIG. 1) and preceding the Schmitt trigger circuit $ST^V$ (FIG. 2), respectively.
Figure 4B:
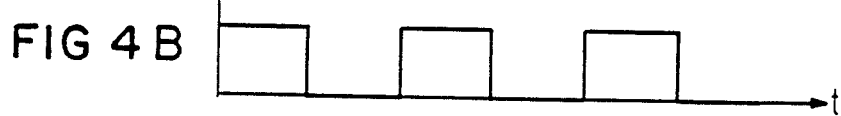
FIG. 4B is a graph of the square-wave signal following the comparator Ko in FIG. 1 and following the Schmitt trigger circuit ST in FIG. 2.
Figure 4C:
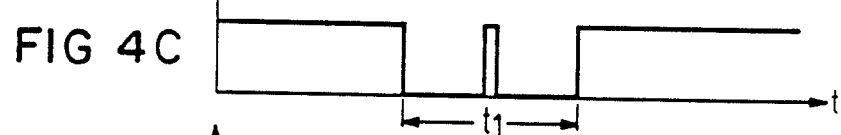
FIG. 4C is a graph of the signal following the OR gate in FIG. 1 and in FIG. 2.
Figure 4D:
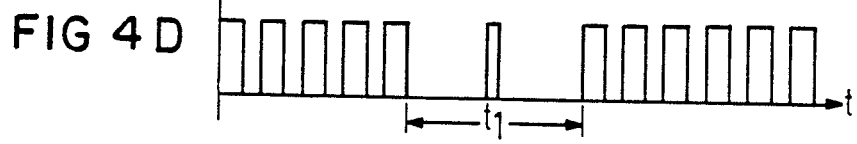
FIG. 4D is a graph of the signal in FIG. 3 taken at the output of OR gate OD.

When the fundamental frequency is higher, the PLL circuit must utilize the primary electron beam PE itself. FIG. 3 shows a corresponding measuring arrangement. The primary electron beam PE pulsed with the frequency fb mixes the signal to be measured to the fixed intermediate frequency df that must be low enough that it can be transmitted by the signal chain. With the use of a further mixing stage M', a second generator (in this embodiment a simple frequency divider FPM) that is synchronized with the beam blanking generator generates the control signal therefrom for the beam blanking generator which is a voltage-controlled frequency oscillator. Mixing directly to extremely low frequencies is not carried out, since this is the frequency range of the topography component also contained in the secondary electron signal The primary electron beam PE is then blanked again at every $n^{th}$ period and a short primary electron pulse for voltage measurement is generated. The trigger signal having the defined frequency fs is acquired by a second mixing stage M''. The utilization of a single side-band mixer as mixing stage M'' is especially advantageous.

In contrast to the circuit set forth in FIGS. 1 and 2, the primary electron beam PE in FIG. 3 is modulated with a defined frequency fb. For example, a suitable beam blanking system is disclosed by U.S. Pat. No. 4,169,229 (hereby incorporated by reference). The beam blanking system BBS is driven with the frequency fb by a generator BBG. The beam blanking system BBS can also be replaced by any other system that produces an intensity modulation of the primary electron beam. For example, the Wehnelt cylinder of the electron source EQ can be used. The frequency fb or one of its upper harmonics is offset by the difference df relative to the frequency fs or one of its upper harmonics of the signal to be measured at a measuring point. The number df is thereby equal to the absolute amount of the difference between the numbers K·fb and L·fs (K, L=whole numbers). Since the measuring point carries a signal having the frequency fs and since the primary electrons are pulsed with the frequency fb, the secondary electron signal as it proceeds via the detector DT, via the photomultiplier PM and, finally, to the output of the pre-amplifier V contains a signal having the frequency df. The secondary electron signal having the frequency df is subsequently filtered out in the band pass filter BP and is further processed in the synchronization circuit. The acquisition of the signal having the frequency df results in a fashion similar to that in the "frequency mapping" measuring method that is set forth in detail in the periodical "Microelectronic Engineering", Vol 2, No. 4, 1985 "Frequency Tracing and Mapping in Theory and Practice", by H. D. Brust and F. Fox, pages 304 through 311.

Circuit components utilized in FIG. 3 that are identical to the circuit components used in FIGS. 1 and 2 are provided with the same reference characters as in FIGS. 1 and 2. For generating the first trigger signal having the frequency fs for the measurement processing arrangement MV' and for providing the drive of the generator BBG with the frequency fb for the modulation of the beam blanking system BBS, the secondary electron signal is taken between the pre-amplifier V and the measurement processing arrangement MV' and is supplied to a band pass filter BP having the center frequency df. This band pass filter BP filters out the secondary electron signal having the mixed frequency df and conducts it to the control circuit ST. Filtering out the signal having the frequency df can also be performed by synchronous rectification thereby eliminating the band pass filter BP. With proper dimensioning of the low pass filter TP" that is contained in the control circuit ST, the band pass filter BP can be eliminated. The first output of the control circuit ST, that provides a signal having the frequency fs, is connected to the trigger input $TR_{IN}$, of the measurement processing arrangement MV' and is also connected to an AND gate UD via a frequency divider FP' and the following monostable circuit MF. Similar to the embodiment in FIG. 1, the frequency divider can also be eliminated under certain conditions. The AND gate UD is connected via its second input to the second output of the control circuit ST, whereby the control circuit ST supplies a signal having the modulation frequency fb on this output. An OR gate OD is connected in a similar manner to the connection in the circuits of FIGS. 1 and 2. Its first input is connected to the measurement processing arrangement MV' via the trigger output $TR_{OUT}$, and its second input is connected to the output of the AND gate UD. The output of the OR gate is connected via the generator BBG to the beam blanking system BBS and, other than for a voltage measurement, supplies this system with signals having the frequency fb and supplies it with a short drive pulse inside a time window $t_1$.

The control circuit ST has two mixer stages M', M", a low pass filter TP", a frequency divider FP", and a voltage-controlled frequency oscillator VCO'. For example, such a voltage-controlled frequency oscillator VCO' may be a synthesizer model HP 8656 A of Hewlett-Packard that, first, can supply a fixed frequency of, for example, 10 MHz via a crystal oscillator and, second, can supply a variable frequency fb that is externally voltage-controlled. The input of the first mixer stage M' also forms the input of the control circuit ST, whereas the second input of the first mixer stage is connected to the first input of the second mixer stage M" and to the output of the frequency divider FP". Together, the mixer stage M' and the low pass TP" form a phase detector that compares the frequencies of the signals on its two inputs to one another. Other types of phase detectors, of course, can be utilized. The frequency divider FP" divides the fixed-frequency signal of the voltage-controlled frequency oscillator VCO' by a ratio 1:m. The first of the two outputs of the voltage-controlled frequency oscillator VCO' is connected to the frequency divider FP". The output of the first mixer stage M" is connected via the low pass filter TP" to the voltage-controlled frequency oscillator VCO' and thus controls the signal having the frequency fb that is provided on the second output of the frequency oscillator VCO'. The second output of the frequency oscillator VCO' that also forms the output of the control circuit ST is also connected to the second mixer stage M" via the second input thereof. The output of the second mixer stage M" that supplies a signal having the frequency fs forms the first output of the control circuit ST.

Similar to the circuit set forth in conjunction with FIG. 1, the feedback can be entirely eliminated in the arrangement shown in FIG. 2 when only the fundamental voltage curve is of interest rather than an exact voltage measurement. Moreover, it is also advantageous in FIGS. 2 and 3 to set the control voltage of the spectrometer to a constant value for generating the trigger signal. To that end, a switch-over means SW can be integrated into the feedback, as shown in the circuit of FIG. 1.

FIG. 4 shows four signal curves A, B, C, D that appear at the locations in FIGS. 1, 2 and 3 correspondingly referenced with lower case letters a, b, c, d. FIG. 4A shows the signal curve from FIGS. 1 and 2 respectively preceding the comparator Ko or preceding the Schmitt trigger circuit ST. A sinusoidal curve has been assumed, this, however being subsequently reshaped into a square-wave signal. This square-wave signal may be seen in FIG. 4B and occurs in FIG. 1 following the comparator Ko and in FIG. 2 following the Schmitt trigger circuit ST. The signal curve from FIG. 4C is taken following the OR gate OD in FIG. 1 and in FIG. 2. It is assumed that the measurement processing arrangement MV of FIG. 1 only triggers a measuring event (see FIG. 4C) within every third square-wave pulses (of FIG. 4B). The short pulse inside the measuring window having the chronological duration $t_1$ can be clearly seen to be in the middle of the measuring window. With the assistance of the generator BBG, this short pulse respectively generates a brief primary electron pulse in the beam blanking system BBS. The short pulse inside the time window is generated in the measurement processing arrangement MV as a consequence of the first trigger signal. As already mentioned, it is necessary for acquiring the first trigger signal outside of the time measuring window that the primary electron beam PE be constantly gated. For this reason, the monostable circuit MF in FIGS. 1 and 2 is designed such that it constantly gates the primary beam PE outside of the time window via the OR gate OD and via the generator BBG. FIG. 4D shows the analogous signal curve for FIG. 3. Here, too, a time window having the chronological duration $t_1$ exists within which the measurement is carried out. Outside of this window, however, the primary electron beam PE is modulated with a signal having the frequency fb. The signal curve of FIG. 4D can be taken at the output of the OR gate OD of FIG. 3. As in FIGS. 1 and 2, the short pulse for actual measurement is generated in the measuring processing arrangement MV'.

When, in the detection of the secondary electrons SE in FIG. 1, FIG. 2 or FIG. 3 of the drawings, a spectrometer SP, particularly a retarding field spectrometer, is used as known, for example, from U.S. Pat. No. 4,292,519, (herein incorporated by reference) then quantitative measurements can be carried out. The use of a spectrometer SP is not only useful for voltage measurement. When a feedback loop is not used but, rather a constant voltage is applied to the retarding field grid of the retarding field spectrometer, then only secondary electrons having a potential that lies above that of the retarding field electrode are allowed to pass. Disturbing influences of local fields are thereby suppressed.

The mixing with a fixed intermediate frequency is based on a non-linear switch characteristic produced by the pulsing of the primary electron beam. This can also be achieved when, instead of the primary electrons, the secondary electrons or the secondary electron signal have their intensity modulated. This is possible, for example, by the energy threshold of a retarding field spectrometer being modulated with the frequency fb. By taking the spectrometer characteristic into consideration, a sinusoidal modulation of the secondary electron signal can even be achieved and potential difficulties with cross-modulation products are avoided, as may occur under certain conditions in the described method since the primary electrons, for example, can also be pulsed with square-wave signals. Due to the higher capacitances to be reloaded and due to the energy dispersion of the secondary electrons, the limit frequency when pulsing a means in the signal processing is lower. Moreover, the field of vision is limited by the spectrometer. Analogously, the photomultiplier can also be operated together with a gate circuit or can be modulated in the video signal path. In this case, the band width, however, is greatly limited by the scintillation of the detector.

Of course, interactions can also be exploited instead of a primary/secondary electron beam. Included here, for example, is the influencing of the secondary or photoelectrons generated by a primary electron or laser beam by a magnetic field For instance, the movement of magnetic domains in magnetic bubble memories could be investigated by exploiting this so called "magnetic contrast".

The primary beam need not necessarily be a particle beam consisting of particles as e.g. electron or ion but can also be composed of an arbitrary radiation. When, for instance, a laser beam is used as primary beam PE and an integrated circuit is again used as specimen IC, then the laser beam can generate electron-hole pairs and, thus, free charge carriers in the pn-junctions of the specimen IC. This can then be detected as a change in the power consumption of the specimen IC. The amount of change is also dependent on the switch condition of the respective pn-junction. A periodic change of the switch condition of a pn-junction could therefore be easily identified by a measurement of the supply current of the specimen IC. The supply current of the circuit or its deviation from a quiescent current can directly serve as a measured signal in this case and a special detector is not required.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for voltage measurement with a particle probe without an external trigger signal, comprising the steps of:

charging a point on a sample carrying a first signal with a continuous primary beam;
   deriving a secondary signal from the point;
   supplying the secondary signal to a measurement processing unit;
   obtaining from the secondary signal a first trigger signal which is synchronous to the first signal;
   blanking of the primary beam for a first time interval, said blanking caused by the first trigger signal;
   causing a second trigger signal by the first trigger signal, the second trigger signal causing generation of a pulse of the primary beam within the first time interval; and
   providing a measurement signal from the secondary signal.

2. The method according to claim 1, wherein a signal with the fundamental frequency of the secondary signal is filtered out for the first trigger signal and is subsequently compared to a threshold; wherein, when the difference between the threshold and the secondary signal changes in operational sign, the first trigger signal is triggered; wherein the primary beam is constantly gated by the first trigger signal except for a time ($t_1$), whereby the second trigger signal is triggered in the measurement processing arrangement in said time ($t_1$), being triggered as a function of the first trigger signal.

3. The method according to claim 1, wherein an auxiliary signal synchronized to the fundamental frequency of the secondary signal is generated with a synchronization circuit; wherein the synchronous auxiliary signal is the first trigger signal; wherein the primary beam is constantly gated by the first trigger signal except for a time ($t_1$), whereby the second trigger signal is triggered in the measurement processing arrangement as a function of the first trigger signal, being triggered in the time ($t_1$).

4. The method according to claim 3, wherein the synchronous auxiliary signal is reduced in frequency.

5. A method for voltage measurement with a particle probe without an external trigger signal, comprising the steps of:

charging a point on a sample carrying a first signal having a first frequency, fs, with a primary beam;
   generating a secondary signal by detecting secondary particles triggered at the point by the primary beam;
   supplying the secondary signal to a measurement processing unit;
   modulating with a second frequency, fb, one of the intensity of the primary beam, the intensity of a beam of the secondary particles and the secondary signal, the second frequency or one of its harmonic oscillations being different from the first frequency, fs, and its harmonic oscillations;
   obtaining from the secondary signal a first trigger signal which is synchronous to the first signal;
   blanking of a primary beam for a first time interval, said blanking caused by the first trigger signal;
   causing a second trigger signal by the first trigger signal, the second trigger signal causing generation of a pulse of the primary beam within the first time interval; and
   providing a measurement signal from the secondary signal.

6. The method according to claim 5, wherein a further signal having a third frequency (df) is filtered out of the secondary signal and is used for controlling a third signal having the second frequency (fb), whereby the third frequency, df, corresponds to the absolute value of the L-fold of the first frequency, fs, and the K-fold of the second frequency, fb; and mixing an externally generated fourth signal of the third frequency, df, with the third signal and obtaining the first trigger signal therefrom.

7. The method according to claim 4 or 5, wherein said secondary signal is derived from the point via a detector.

8. An apparatus for voltage measurement having an particle probe without an external trigger signal and with the use of a microscope, the apparatus having a signal chain for processing a secondary signal that is derived from a point of a specimen charged by a primary beam, whereby the signal chain has a detector and a measurement processing arrangement, whereby the specimen is connected to a drive circuit, whereby at least one of a generator for driving a beam blanking system for intensity modulation of the primary beam and of a means for signal processing and of the energy threshold of a spectrometer is contained therein, comprising:
- a trigger input of the measurement processing arrangement is connected to a location in the signal chain following the detector and preceding the measurement processing arrangement being connected thereto via a threshold switch with a preceding filter;
- an output of the threshold switch connected via a monostable circuit and a trigger output of the measurement processing arrangement connected via a common OR gate to the generator for the drive of the beam blanking system.

9. The apparatus according to claim 8, wherein the filter is a low pass filter.

10. An apparatus for voltage measurement having a particle probe without an external trigger signal with the use of a microscope, the apparatus having a signal chain for processing a secondary signal that is derived from a point of a specimen charged by a primary beam, whereby the signal chain has a detector and a measurement processing arrangement, whereby the specimen is connected to a drive circuit, whereby at least one of a generator for driving a beam blanking system for intensity modulation of the primary beam and of a means for signal processing and of the energy threshold of a spectrometer is contained therein, comprising:
- a trigger input of the measurement processing arrangement connected to a location in the signal chain following the detector and preceding the measurement processing arrangement, being connected thereto via a threshold switch with a preceding filter;
- an output of the threshold switch connected via a monostable circuit and a trigger output of the measurement processing arrangement connected via a common OR gate to the generator for the drive of the beam blanking system;
- the threshold switch containing a comparator;
- a first input of the comparator being connected to an output of the filter, a second input of the comparator being connected to an external, variable voltage; and
- an output of the comparator being connected to a trigger input of the measurement processing arrangement and to the monostable circuit.

11. The apparatus according to claim 10 wherein a comparator having hysteresis properties is utilized as the threshold switch.

12. An apparatus for voltage measurement having a particle probe without an external trigger signal and with the use of a microscope, the apparatus having a signal chain for processing a secondary signal that is derived from a point of a specimen charged by a primary beam, whereby the signal chain has a detector and a measurement processing arrangement, whereby the specimen is connected to a drive circuit, whereby at least one of a generator for driving a beam blanking system for intensity modulation of the primary beam and of a means for signal processing and of the energy threshold of a spectrometer is contained therein, comprising:
- a trigger input of the measurement processing arrangement connected to a location in the signal chain following the detector and preceding the measurement processing arrangement, being connected thereto via at least a series connected synchronization circuit and a comparator circuit;
- an output of a frequency divider connected via a monostable circuit and a trigger output of the measurement processing arrangement connected via a common OR gate to the generator for the drive of the beam blanking system, said frequency divider having an input connected to an output of the comparator circuit.

13. The apparatus according to claim 12, wherein a trigger input of the measurement processing arrangement is connected to the comparator circuit via the frequency divider.

14. The apparatus according to claim 12, wherein the synchronization circuit contains a phase detector connected in series to a voltage-controlled frequency oscillator; wherein a first input of the phase detector is the input of the synchronization circuit; wherein a second input of the phase detector is connected to an output of the voltage-controlled frequency oscillator and to the comparator circuit.

15. The apparatus according to claim 14 wherein the phase detector contains a mixer stage having an output connected to a low pass filter.

16. An apparatus for voltage measurement with an particle probe without an external trigger signal with the use of a microscope, the apparatus having a signal chain for processing a secondary signal that is derived from a point of a specimen charged by a primary beam, whereby the signal chain has a detector and a measurement processing arrangement, whereby the specimen is connected to a drive circuit, the apparatus further having a generator for driving a modulation system for the modulation of at least one of the primary beam and of a means for signal processing and of the energy threshold of a spectrometer having said modulation system having further a variable frequency (fb) that deviates from a fixed frequency (fs), comprising:
- a control circuit having an input connected to an output thereof a band pass filter, an input of the band pass filter being connected to a location in the signal chain following the detector and preceding the measurement processing arrangement;
- a first output of the control circuit that supplies a signal having the fixed frequency (fs) connected to a trigger input of the measurement processing arrangement and to a first frequency divider;
- the first frequency divider connected via a monostable circuit to a first input of an AND gate and a second output of the control circuit that supplies a signal having the variable frequency (fb) connected to a second input of the AND gate;
- an output of the AND gate and a trigger output of the measurement processing arrangement each forming an input for an OR gate;
- an output of the OR gate connected to the generator for driving said modulation system.

17. The apparatus according to claim 16, wherein the control circuit contains a mixer stage, a voltage-controlled frequency oscillator, a second frequency divider and a phase detector; wherein a first input of the phase detector is the input of the control circuit;

wherein a second input of the phase detector is connected to a first input of the mixer stage and to an output of the second frequency divider;

wherein an output of the phase detector is connected via a low pass filter to an input of the voltage-controlled frequency oscillator;

wherein a first output of the voltage-controlled frequency oscillator that supplies a signal having the variable frequency (fb) forms the second output of the control circuit and is also connected to the second input of the mixer stage;

wherein a second output of the voltage-controlled frequency oscillator that supplies a signal having a further fixed frequency is connected to an input of the second frequency divider and an output of the mixer stage that supplies a signal having the fixed frequency (fs) forms the first output of the control circuit.

18. The apparatus according to claim 17, wherein the phase detector contains a second mixer stage series connected to the following low pass filter.

19. An apparatus for voltage measurement having a particle probe without an external trigger signal and with the use of a microscope, the apparatus having a signal chain for processing a secondary signal that is derived from a point of a specimen charged by a primary beam whereby the signal chain has a detector and a measurement processing arrangement, whereby the specimen is connected to a drive circuit, whereby at least one of a generator for driving a beam blanking system for intensity modulation of the primary beam and of a means for signal processing and of the energy threshold of a spectrometer is contained therein, comprising:

a trigger input of the measurement processing arrangement connected to a location in the signal chain following the detector and preceding the measurement processing arrangement, being connected thereto via a threshold switch with a preceding filter;

an output of the threshold switch connected via a monostable circuit and a trigger output of the measurement processing arrangement connected via a common OR gate to the generator for the drive of the beam blanking system; and for measuring, the measurement processing arrangement providing a measurement signal on a measured signal output connected to a spectrometer via a switch wherein when no measurement takes place, the spectrometer is connected to a constant voltage via the switch.

20. An apparatus for voltage measurement having a particle probe without an external trigger signal and with the use of a microscope, the apparatus having a signal chain for processing a secondary signal that is derived from a point of a specimen charged by a primary beam, whereby the signal chain has a detector and a measurement processing arrangement, whereby the specimen is connected to a drive circuit, whereby at least one of a generator for driving a beam blanking system for intensity modulation of the primary beam and of a means for signal processing and of the energy threshold of a spectrometer is contained therein, comprising:

a trigger input of the measurement processing arrangement is connected to a location in the signal chain the modulation for measurement being carried out by a second trigger signal from the measurement processing arrangement, and when no measurement takes place the modulation being carried out by the first trigger signal;

the threshold switch containing a comparator with a first input of the comparator connected to an output of the filter, a second input of the comparator connected to an external, variable voltage and an output of the comparator connected to a trigger input of the measurement processing arrangement and to the monostable circuit; and said comparator circuit being a Schmitt trigger.

21. The apparatus according to claim 12 or 16, wherein for measuring, the measurement processing arrangement provides a measurement signal on a measured signal output connected to a spectrometer via a switch wherein when no measurement takes place, the spectrometer is connected to a constant voltage via the switch.

22. The apparatus according to claim 12 or 16, wherein said comparator circuit is a Schmitt trigger.

* * * * *